(12) United States Patent
Vermeulen et al.

(10) Patent No.: US 7,076,709 B2
(45) Date of Patent: Jul. 11, 2006

(54) TESTING OF CIRCUIT WITH PLURAL CLOCK DOMAINS

(75) Inventors: Hubertus Gerardus Hendrikus Vermeulen, Eindhoven (NL); Sandeep Kumar Goel, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/502,825

(22) PCT Filed: Dec. 23, 2002

(86) PCT No.: PCT/IB02/05706

§ 371 (c)(1),
(2), (4) Date: Jul. 27, 2004

(87) PCT Pub. No.: WO03/065065

PCT Pub. Date: Aug. 7, 2003

(65) Prior Publication Data

US 2005/0076278 A1   Apr. 7, 2005

(30) Foreign Application Priority Data

Jan. 28, 2002  (EP) .................................. 02075343

(51) Int. Cl.
*G01R 31/28* (2006.01)

(52) U.S. Cl. ...................... 714/729; 714/731

(58) Field of Classification Search .................. None
See application file for complete search history.

(56) References Cited

U.S. PATENT DOCUMENTS

| | | | |
|---|---|---|---|
| 5,878,055 A * | 3/1999 | Allen .......................... | 714/744 |
| 6,131,173 A * | 10/2000 | Meirlevede et al. ........ | 714/726 |
| 6,327,684 B1 | 12/2001 | Nadeau-Dostie et al. | |
| 6,742,151 B1 * | 5/2004 | Park et al. .................. | 714/729 |

* cited by examiner

*Primary Examiner*—Christine T. Tu

(57) ABSTRACT

An electronic circuit has a plurality of sub-circuits. Clock gate circuits supply gated clock signals to data storage elements of the sub-circuits. The clock gate circuits have gate inputs for receiving gate signals that commands blocking passage of the clock signal. Data can be transferred between data storage elements between two of the subcircuits. A detector circuit flags invalid data in the data storage element of the second one of the sub-circuits. The detector circuit has a flag storage element arranged to set a flag when the clock gate circuit of the second one of the sub-circuits passes the clock signal for the second one of the sub-circuits after the clock gate of the first one of the sub-circuits has blocked the clock signal for the first one of the sub-circuits. The flag indicates the relative phase of the clocks signals of different sub-circuits when the clocks are stopped. The flag is used to invalidate data in the data storage element of the second one of the sub-circuits.

8 Claims, 3 Drawing Sheets

TESTING OF CIRCUIT WITH PLURAL CLOCK DOMAINS

The field of the invention is an electronic circuit that comprises a plurality of clock domains and a method of testing such an electronic circuit.

For a number of reasons integrated circuits are increasingly split into multiple clock domains that have their own clocks signals (this split usually occurs only in a functional sense, not physically). The use of different clock domains lowers the requirements on skew of the clock signals used for different sub-domains and it can be used to reduce power consumption by the circuit for example. In a circuit with multiple clock domains the clock signals of different clock domains are mutually different for example in terms of phase, frequency or duty cycle etc. In each domain the supply of the clock signal to sub-circuits in that clock domain can be switched off independently from the other clock domains.

Unfortunately the use of different clock domains makes testing and debugging of the electronic circuit more difficult. U.S. Pat. No. 6,131,173 describes a solution to mitigate these difficulties. At the interface between two clock domains an interface circuit is inserted that can isolate the different clock domains from one another in a test mode. This interface makes it possible to supply or extract test data to or from the isolated clock domains.

This technique, however, does not make it possible to test or debug the sub-circuits from different clock domains when they cooperate with one another. To debug such cooperative operation it is necessary to allow the sub-circuits to cooperate while each is clocked with its own clock signal. Upon a stop request from the tester, debugger or on-chip debug hardware, the clocks are stopped in order to inspect the data produced during the cooperation of the circuits. However, it has been found that such a method of debugging does not always produce reliable results. For example, comparison of the data produced during cooperation does not consistently match simulation data, even when the circuit is operating properly.

Amongst others, it is an object to facilitate debugging and testing of electronic circuits that contain multiple clock domains in which sub-circuits from different clock-domains cooperate with one another.

The electronic circuit according to the invention is set forth in claim 1. It has been realized that the unreliability of the results of debugging is a consequence of the fact that it is impossible to stop the clocks in different clock domains simultaneously. For example, it is usually necessary to complete the current clock cycle before the clock can be stopped. Thus, due to phase and frequency differences between the different clock signals, the clock of a first clock domain may be stopped before the clock of a second clock domain.

This may have the effect that a data storage element in the second clock domain captures invalid data, more in particular data that should have been updated before it was captured, but was not updated because the clock signal of the first clock domain was stopped before the update. This happens when an active part of a clock signal that controls update data in the data storage element in the first clock domain is suppressed in the time interval between the signal to stop the clocks and the time when data is captured by the data storage element in the second clock domain (the active part may be an clock signal edge in case of a edge triggered data storage elements, or a pulse in case of pulse triggered data storage elements etc.). In the prior art the debugger or tester cannot see whether this has happened or not. Therefore this may lead to misleading conclusions about the operation of the circuit.

According to the invention a detector is provided accompanying the interface between a first and second one of the sub-circuits from different clock-domains. The detector is arranged to detect the conditions under which data is captured when the clocks of the sub-circuits are stopped. In a sense it determines the phase relation between the clock signals to the extent that this phase relation is relevant for data transfer between clock domains at the time when the clock signals are stopped. This enables the tester or debugger to evaluate the captured data properly, for example by discarding data that has been captured too late.

In an embodiment of the invention the detector is implemented with a pair of flag storage elements. The first flag storage element sets a pre-flag in response to the clock signal of a first sub-circuit when that clock signal is no longer passed to the first sub-circuit and the second flag storage element copies the pre-flag in response to the clock signal of the second sub-circuit when that clock signal is passed to the second sub-circuit. Thus, the flag represents whether the clock signal of the second circuit has caused data to be captured after the clock of the first sub-circuit has been blocked.

In another embodiment a pipeline data storage element is added to the data storage element of the second sub-circuit. The pipeline data storage element stores overwritten data from the data storage element. Thus, both data for a clock cycle and a preceding clock cycle is retained and the one or the other may be used dependent on whether the flag is set. In this way consistent data can be assured.

Preferably both the flag and the data can be read out via a conventional scan chain when the clocks have been stopped, or, as an alternative, the flag can control which data is read out via the scan chain.

These and other objects and advantages of the electronic circuit according to the invention and of the method of testing this circuit will be described in more detail using the following figures.

Figure 1:
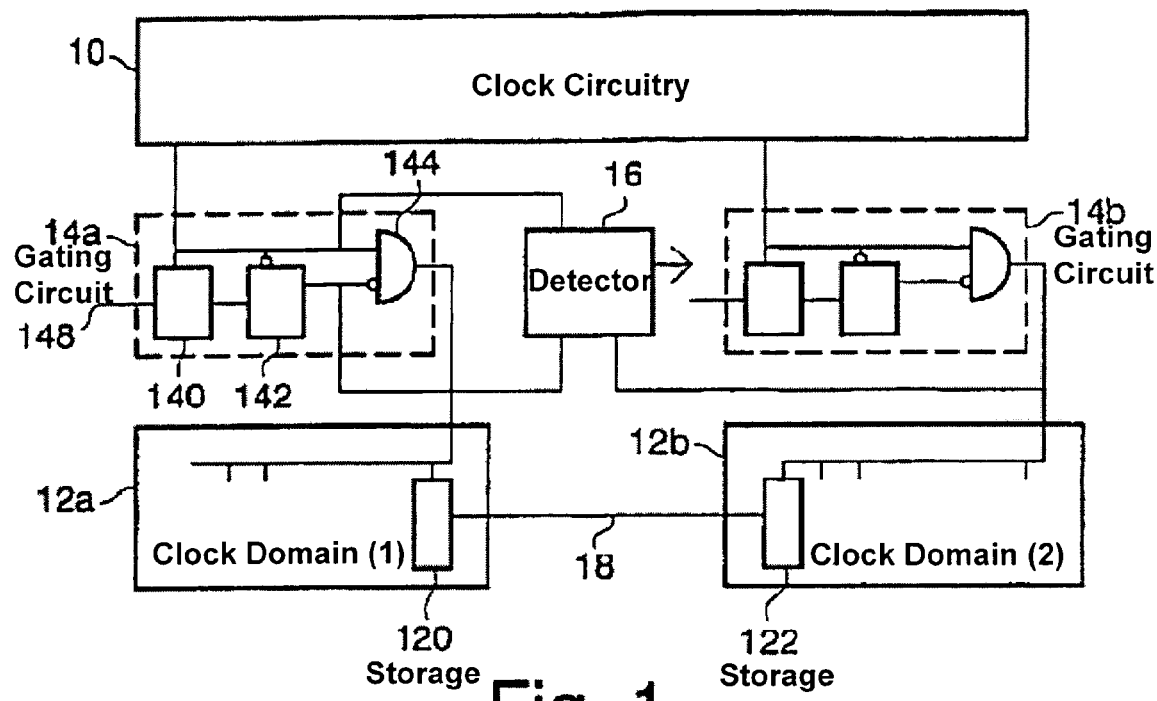
FIG. 1 shows an electronic circuit with multiple clock domains.

FIG. 1 shows an electronic circuit with multiple clock domains. The circuit contains clock circuitry 10, two clock domains 12a,b, with a first storage element 120 and a second storage element 122 respectively, clock gating circuits 14a,b and a detector 16. The first storage element 120 has a data output coupled to a data input of the second storage element 122. Although a direct connection is shown, it will be appreciated that this connection may run via combinatorial logic circuits (not shown). Clock outputs of the clock circuitry 10 are coupled to the clock inputs of the first and second data storage element 120, 122 via the respective clock gating circuits 14a,b. Further storage elements (not shown) may be present in the clock domains 12a,b, possibly coupled to each other inside the domains via combinatorial logic circuits (not shown). These further data storage elements are also clocked by the clock signals from the respective clock gating circuit 14a,b. Similarly, although a single output and input are shown for data storage elements 120, 122, it will be clear that this output and input may provide for a single bit or multiple bits. All circuits are preferably included on the same integrated circuit, but of course circuits distributed over different integrated circuits may be used instead.

By way of example both clock gating circuits 14a,b are shown to have a similar structure, containing a first flip-flop 140, a second flip-flop 142 and an AND gate 144. A clock output from clock circuitry 10 is coupled to clock inputs of first and second flip-flop 140, 142 and to a first input of AND gate 144. A data input 148 of the first flop-flop 140 forms a clock gate command input of the clock gating circuit 14a. A data output of the first flip-flop 140 is coupled to a data input of the second flip-flop 142. A data output of the second flip-flop 142 is coupled to a second input of the AND gate 144. The output of the AND gate 144 is coupled to a clock input of the clock domain 12a, where it is coupled to the clock input of the first storage element 120. Similarly, the clock gating circuit 14b of the second sub-circuit has a clock gate command input, a clock input coupled to clock circuitry 10 and a clock output coupled to the clock input of second clock domain 12b, where it is coupled to the second storage element. The first and second input of the AND gate 144 and the clock output of clock gating circuit 14b of the second sub-circuit are coupled to the detector 16.

It will be appreciated that the precise structure of the clock gating circuits is shown for illustration purposes only. Without deviating from the invention any other type of clock gating circuit that allows gating of clock signals may be used.

In operation, clock gating circuits 14a,b normally pass clock signals from the clock circuitry 10 to clock domains 12a,b. When a stop signal is asserted at the clock gate command inputs of the clock gating circuits 14a,b these clock gating circuits 14a,b block passage of the clock signals to their respective clock domains 12a,b after a complete clock cycle has occurred. Detector 16 detects whether data is loaded into second data storage element 122 when that data has been affected by the fact that data was not loaded into first data storage element 120 after the stop signal has been asserted.

Figure 2:
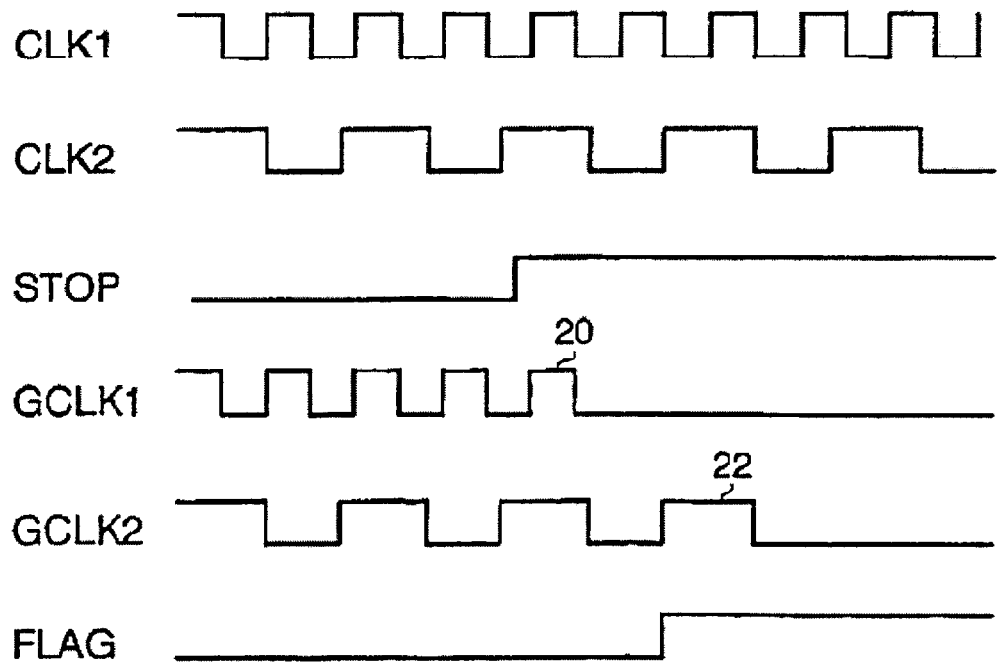
FIG. 2 shows signals that occur during operation.

FIG. 2 shows signals occurring during operation. A first and second trace show clock signals CLK1, CLK2 output by clock circuitry 10 to clock gating circuits 14a,b. A third trace shows a stop signal STOP which is applied to the clock gate command inputs of the clock gating circuits 14a,b. A fourth and fifth trace show gated clock signals GCLK1, GCLK2 that the clock gating circuits 14a,b pass to clock domains 12a,b. A sixth trace shows the signal FLAG output by detector 16.

The signal STOP causes the clock gating circuits 14a,b to pass only one positive clock pulse 20, 22 after the STOP signal has been asserted. Subsequently the clock signal is blocked. When the STOP signal is not asserted AND gate 144 passes all clock pulses. On the rising edge of this clock pulse 20, 22 the first flip-flop 140 copies the STOP signal from the clock gating command input 148. On the falling edge of this clock pulse 20, 22 the second flip-flop 142 copies the STOP signal which then disables AND gate 144 from passing further clock pulses. Detector 16 monitors whether AND gate 144 receives any clock pulses after AND gate 144 has been disabled from passing further clock pulses. If this happens and subsequently second clock gating circuit 14b outputs a clock pulse detector 16 sets its output signal FLAG to indicate that second data storage element 122 may have captured invalid data.

Figure 3:
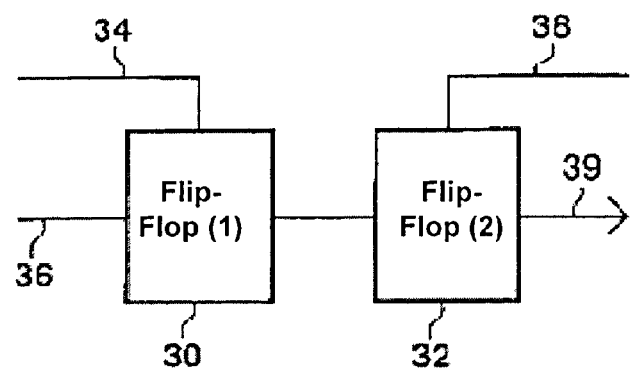
FIG. 3 shows a detection circuit.

FIG. 3 shows an example of an implementation of detector 16. This implementation contains a first flip-flop 30 and a second flip-flop 32. The clock suppressing signal from first clock-gating circuit 14a (from the output of the second flip-flop 142 in that first clock-gating circuit 14a) is applied to a data input 36 of first flip-flop 30. This first flip-flop 30 receives the ungated clock signal CLK1 of first clock gating circuit 14a at a clock input 34. The data output of first flip-flop 30 is coupled to a data input of second flip-flop 32. Second flip-flop 32 has a clock input 38 coupled to the gated clock output of second clock gating circuit 14b (outputting GCLK2). A data output 39 of second flip-flop 32 supplies output signal FLAG of detector 16.

In operation, first flip-flop 30 of detector 16 is set when first clock gating circuit 14a suppresses a clock pulse. This set data from first flip-flop 30 is copied to second flip-flop 32 when that second flip-flop 32 is clocked after the clock pulse. First flip-flop 30 and second flip-flop 32 mimic first and second data storage element 120, 122 to detect whether invalid data may be captured by the second data storage element. Copying of predetermined flag data by second flip-flop 32 is indicative of copying of invalid data by second data storage element 122. The predetermined flag data is set-up because a difference between flip-flops 30, 32 and data storage elements 120, 122 is that first flip-flop 30 receives the ungated clock, i.e. the clock that should be present to produce valid data for second data storage element 122, and that predetermined flag data (the STOP signal) is loaded into first flip-flop 30 when the clock signal is suppressed.

It will be noted that there may be timing differences between clock signals applied to the data storage elements 120, 122 and clock signals applied to detector 16, for example due to differences in the delay experienced by the clock signals before they reach the respective circuits. This is no problem when detector 16 is made to detect a worst-case situation. Preferably, therefore, it is ensured that the delay experienced by the first domain clock signals that are used in detector 16 is shorter than (or at least as short as) the delay with which these signals are applied to the first domain 12a, while the delay experienced by the second domain clock signals that are used in detector 16 is longer than (or at least as long as) the delay with which these signals are applied to the second domain 12b.

It will be appreciated that the selection of the clock edges at which first and second flip-flop 30, 32 in detector 16 load information corresponds to the clock edges at which data first and second storage elements 120, 122 load data. So if second storage element loads data on negative clock edges, for example, second flip-flop 32 preferably loads the flag on negative clock edges as well. The same goes for the first flip-flop 30 of detector 16 with respect to first data storage element 120 and for dual edge triggering, pulse controlled data loading etc.

It will be appreciated that the invention is not limited to the implementation of the detector 16 shown in FIG. 3, or to using the particular signals used by that detector. Any detector may be used that detects whether a clock pulse is output to second clock domain 12b after a pulse from first clock gating circuit 14a has been suppressed. Similarly it will be appreciated that any way of stopping the clocks may be used, for example passing a greater or lesser part of the clock signals after assertion of the stop signal, as long as detector 16 detects whether an active clock edge occurs from second clock gating circuit 14b after an active clock edge from first clock gating circuit 14a has been suppressed.

In practice, various circuits may be added in order to protect transfer of data from the first clock domain 12a to the second clock domain 12b in order to prevent a change of data in the data storage element 122 close to the point in time when the data in the other data storage element 120 is changed. This may be implemented by any known means, such as handshake signals, semaphores, clock arbiters at the clock input of the storage elements etc. However, such means have been omitted from the figures for the sake of clarity, since they do not affect the timing relation between the clock signals, but only the data transferred. The detection principle for determining the timing relation between the clock signals remains the same.

Figure 4:
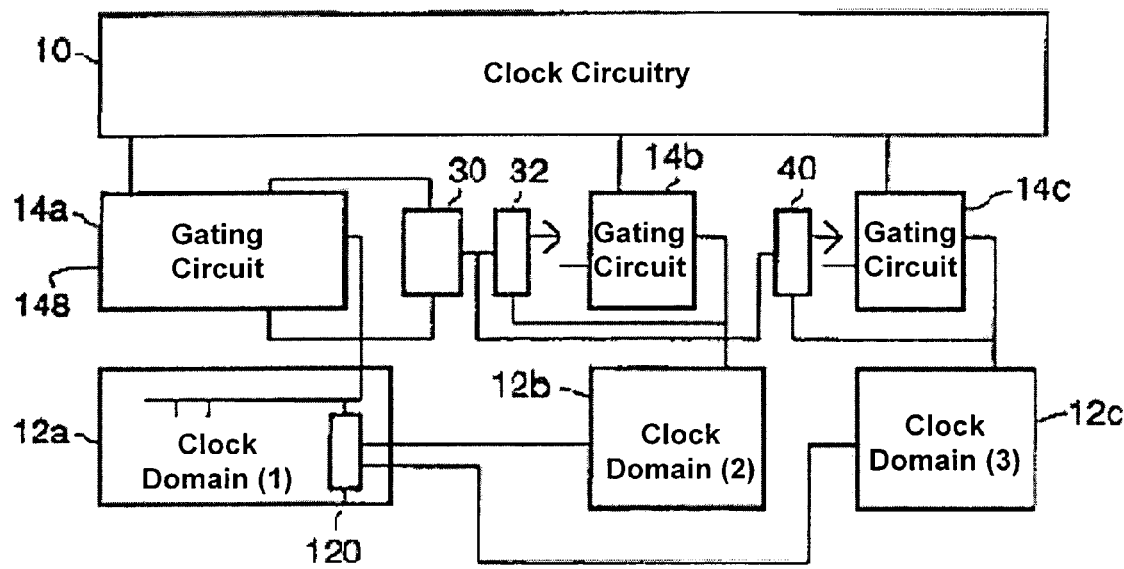
FIG. 4 shows an electronic circuit with multiple clock domains.

FIG. 4 shows an electronic circuit with three clock domains. In addition to the clock domains 12a,b a third clock domain 12c with a third clock gating circuit 14c is shown. The first data storage element 120 of the first clock domain 12a is coupled to the third clock domain 12c. Thus, invalid data transfer may occur from the first clock domain 12a, to both the second and third clock domain 12b,c. When the second and third clock domain 12b,c have independent clocks this may occur independently for the second and third clock domain 12b,c. In principle, separate detectors may be provided to detect this. However, when detectors similar to the one shown in FIG. 3 is used, the first flip-flop 30 of the detector may be shared by the second and third domain 12b,c, only the second flip-flop 32, 40 being provided separately for the different domains 12b,c. Of course, more second flip-flops 32, 40 may be provided when first domain 12a interfaces to more than two domains 12b,c.

As shown, the circuit allows detection of copying of invalid data in the second clock domain 12b, but no correction. Thus, if it is necessary to inspect the data captured by the second data storage element 122 the circuit may have to be restarted a number of times until detector 16 indicates that no invalid data has been captured. If desired, this may be obviated by adding a pipeline of one or more data storage elements to second data storage element 122, for storing successive data values that have been stored in second data storage element 122 previous to current data. In this case, the relevant data may be selected from the pipeline on the basis of the output signal of the detector.

Any means may be used to read data from the data storage elements 120, 122 and to read detection results from detector 16. For example, a conventional scan chain may be used for this purpose.

Figure 5:
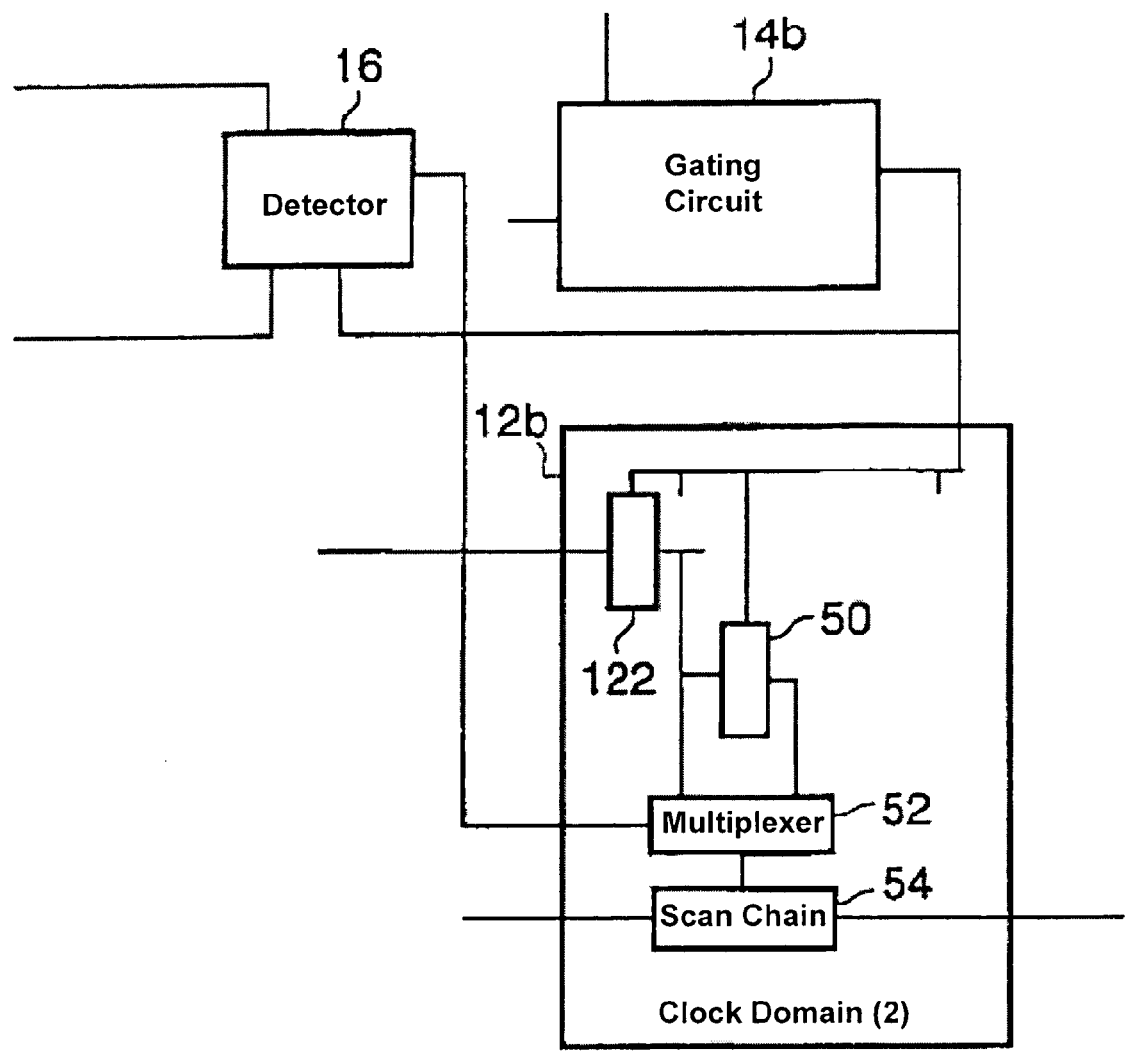
FIG. 5 shows a detail of an electronic circuit.

FIG. 5 shows an example of part of an electronic circuit that provides for correction. The second clock domain 12b and its corresponding clock gating circuit 14b are shown, together with detector 16. The second clock domain 12b is shown to contain a pipeline storage element 50, a multiplexer 52 and part of a scan chain 54. An output of the second data storage element 122 is coupled to the pipeline storage element 50. The output of the second data storage element 122 and the pipeline storage element 50 are coupled to inputs of the multiplexer 52, which has an output coupled to the scan chain 54. The flag output of detector 16 is coupled to a control input of multiplexer 52.

In operation, each time data storage element 122 loads new data, the previous data in data storage element 122 is copied into pipeline storage element 50. Thus, when clock gating circuit 14b stops supplying clock signals to second clock domain 12b, data storage element 122 contains data captured in the last clock cycle and pipeline storage element contains data captured by data storage element 122 in the before last clock cycle. Multiplexer 52 passes the latter to scan chain 54 when detector 16 indicates that a clock cycle in the first clock domain 12a has occurred before data storage element 122 has captured data in the last clock cycle before its clock was stopped. Otherwise, multiplexer 52 passes data from the data storage element 122 to the scan chain 54. Thus, the appropriate test data is passed to scan chain 54.

It will be appreciated that other means than a scan chain can be used to read out the data, or that data from both the data storage element 122 and pipeline storage element 50 may be read out, together with the output of detector 16 to test or debug the circuit. The circuit of FIG. 5, however, has the advantage that a minimum of information needs to be read out.

The invention claimed is:

1. An electronic circuit comprising:
   clock circuitry;
   a first sub-circuit comprising a first clocked data storage element and a first clock gate circuit that is coupled between an output of the clock circuitry and a clock input of the first data storage element;
   a second sub-circuit comprising a second data storage element, within a different clock domain as the first data storage element, and a second clock gate circuit that is coupled between an output of the clock circuitry and a clock input of the second data storage element;
   a data path between the first clocked storage element and the second clocked storage element;
   a detector circuit, coupled between the first sub-circuit and the second sub-circuit, that flags an invalid data write operation in the second data storage element in relation to the first clocked gate circuit receiving a gate signal that commands blocking passage of a first clock signal from the clock circuitry.

2. The electronic circuit of claim 1 wherein the detector circuit comprises:
   a pre-flag storage element that sets a pre-flag in response to the first clock signal from the clock circuitry being blocked; and
   a first flag storage element that copies the pre-flag in response to the second clock gate circuit passing a second clock signal for the second sub-circuit.

3. The electronic circuit of claim 2 further comprising:
   a third sub-circuit comprising, a third clocked data storage element and a third clock gate circuit, that is coupled to receive data from the first clocked data storage element; and
   wherein the detector circuit further comprises a second flag storage element that copies the pre-flag in response to the third clock gate circuit passing a third clock signal for the third sub-circuit.

4. The electronic circuit of claim 1 further comprising a pipeline storage element coupled to the second clocked data storage element for copying data from the second clocked data storage element to preserve erroneously overwritten in the second clocked data storage element.

5. The electronic circuit of claim 4 comprising an output circuit for reading data from the second clocked data storage element and the pipeline storage element in response to a flag not being appropriately set.

6. The electronic circuit of claim 1 further comprising a scan chain, coupled to a flag storage element and the second clocked data storage element, that allows a flag and data from the second data storage element to be read.

7. A method of testing an electronic circuit containing a plurality of clocked data storage elements, the method comprising:
   operating a first clocked data storage element, within the plurality of clocked data storage elements, in a first clock domain;

operating a second clocked data storage element, within the plurality of clocked data storage elements, in a second clock domain that is different than the first clock domain;

commanding a plurality of clock gate circuits, associated with the plurality of clocked data storage elements, to block passage of at least one clock signal;

detecting a write error at the second clocked data storage element caused by the command to block passage of at least one clock signal; and correcting the write error at the second clocked data storage element.

8. The method of claim 7 wherein the write error is detected by removing a flag in response to a complete write operation by the second clocked data storage element.

* * * * *